March 31, 1970 J. J. KLINIKOWSKI 3,504,363

BINARY-CODED DECIMAL SIGNAL CONVERTER

Filed Dec. 22, 1966 2 Sheets-Sheet 1

INVENTOR.
JAMES J. KLINIKOWSKI
BY Robert G. Green
ATTORNEY

March 31, 1970 J. J. KLINIKOWSKI 3,504,363

BINARY-CODED DECIMAL SIGNAL CONVERTER

Filed Dec. 22, 1966 2 Sheets-Sheet 2

INVENTOR.
JAMES J. KLINIKOWSKI
BY Robert A. Green
ATTORNEY

United States Patent Office 3,504,363

Patented Mar. 31, 1970

3,504,363

BINARY-CODED DECIMAL SIGNAL CONVERTER

James J. Klinikowski, Somerville, N.J., assignor to Burroughs Corporation, Detroit, Mich., a corporation of Michigan Filed Dec. 22, 1966, Ser. No. 603,926
Int. Cl. G08c *5/00*
U.S. Cl. 340—347 3 Claims

ABSTRACT OF THE DISCLOSURE

A signal decoder circuit including first and second switching devices, each of which controls two auxiliary switching devices, there thus being four auxiliary switching devices. Each of the auxiliary switching devices controls four display switching devices, there being a total of sixteen display switching devices, and input signal bit sources are coupled through a diode matrix to all of the switching devices in such a way that, for each combination of signal bits having a meaning in binary-coded decimal code, only one of the display switching devices is operated and represents a corresponding decimal number. The circuit can decode a large number of four-bit binary-coded decimal codes.

This invention relates to electronic circuits for performing signal decoding operations, particularly decoding of binary-coded decimal signals to pure decimal signals.

A large number of binary-coded decimal code systems are based on four signal bits, each of which may be logical "1" or a logical "0" as is well known. With four bits of information available, there are sixteen possible different combinations of signal bits which can represent decimal numerals 1 through 16. One system known in the prior art for decoding sixteen combinations of signal bits includes a diode matrix comprising sixty-four diodes and having eight input lines (for the four bits and their complements) and sixteen output lines (for the pure decimal outputs). It can be seen that such a circuit is undesirably expensive and complex to build, either with discrete components or with monolithic or integrated semiconductor circuits.

Other somewhat less complex circuits are known for performing decoding operations; however, these circuits are generally suitable for operating with either one or a relatively small number of the many four-bit code systems which are known. The present invention provides a decoding circuit which is adaptable for operation with all four-bit binary-coded decimal codes known at the present time and can be used to decode all sixteen bit combinations.

Briefly, the system of the invention includes an array of diodes connected to perform a decoding function and, in addition, discharge devices, such as semiconductor switches or amplifiers, arranged so that they, too, perform a decoding function. This sharing of the decoding function by diodes and other discharge devices imparts wide flexibility and utility to the circuits of the invention. More specifically, the system of the invention includes a first pair of control devices, each of which controls another pair of control devices. Each pair of control devices, in turn, controls the operation of a chain of devices. Thus, in a four-bit code system, two bits are applied through diodes to the pairs of control devices, and two bits are applied through diodes to the chains of devices.

The invention is described in greater detail by reference to the drawing wherein.

Figure 1:
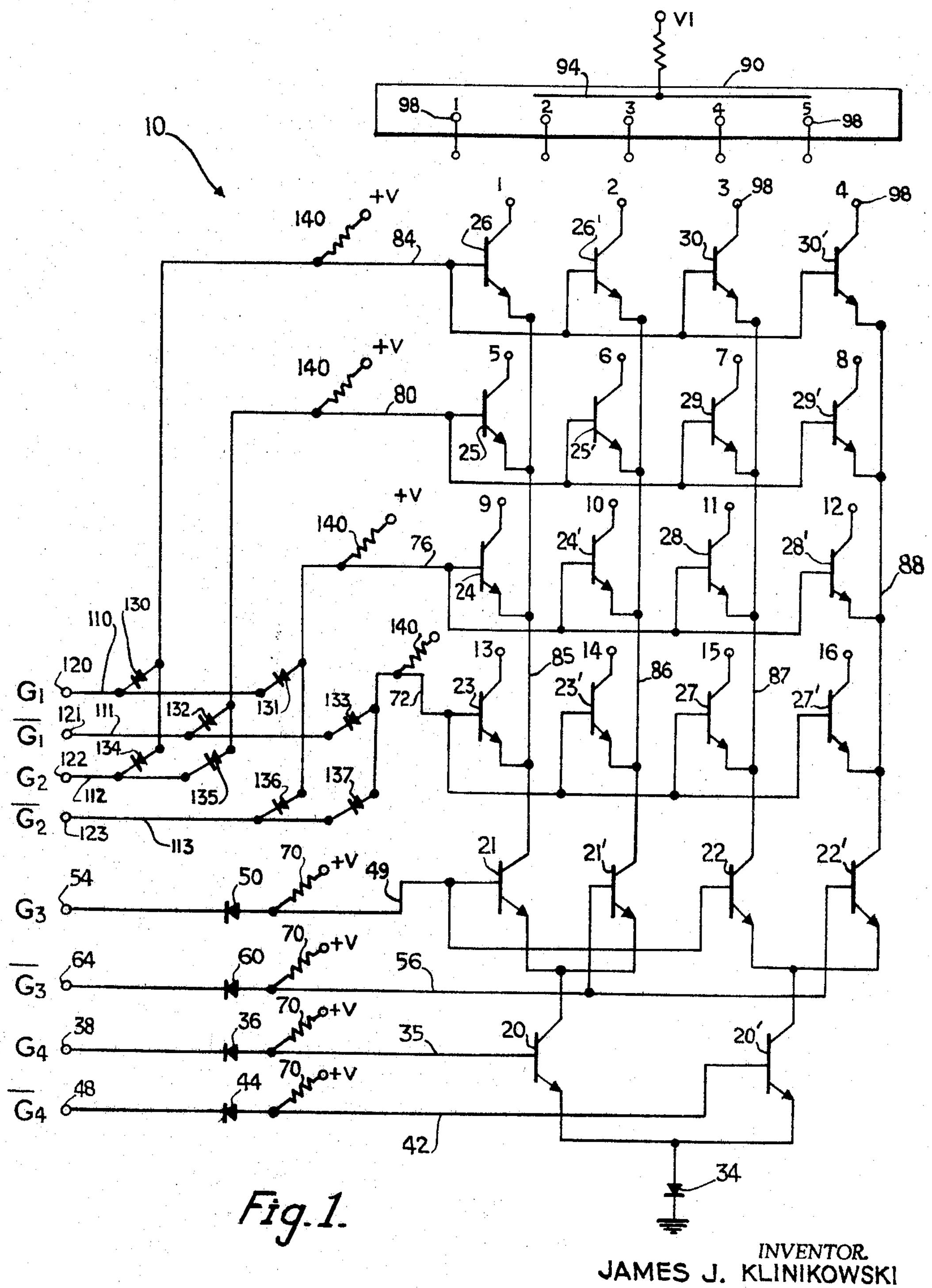
FIG. 1 is a schematic representation of a circuit embodying the invention.

In the following description of the invention, the term transistor can mean a three-electrode, four-electrode, or any other form of semiconductor device which is operable as a switch or amplifier, or the like. For purposes of illustration, all transistors are shown and described as three-electrode devices including base, emitter, and collector electrodes which are represented in conventional fashion.

Referring to the drawing, a decoder circuit 10 embodying the invention includes a first pair of master control sistors 20 and 20′ have their emitters connected through 21, 21′, and a third pair of control transistors 22, 22′. The circuit 10 also includes four pairs of decimal-registering or output transistors 23 and 23′, 24 and 24′, 25 and 25′, 26 and 26′ associated with control transistors 21 and 21′, and four pairs of decimal-registering or output transistors 27 and 27′, 28 and 28′, 29 and 29′, 30 and 30′ associated with control transistors 22 and 22′.

It can be seen that the decimal-registering or output transistors are arrayed in a matrix of four columns with four transistors in each column, and, in addition, these transistors are arrayed in four rows with four transistors in each row.

In the circuit 10, the first pair of master control transistors 20 and 20′ have their emitters connected through a common diode 34 to a reference potential such as ground. The base of transistor 20 is connected by lead 35 through an isolating diode 36 to a signal input terminal 38, and the base of transisor 20′ is conneced by lead 42 through an isolating diode 44 to a signal input terminal 48.

Referring to the second and third pairs of control transistors 21, 21′ and 22, 22′, the bases of transistors 21 and 22 are coupled together and by lead 49 through a single isolating diode 50 to a signal input terminal 54, and the bases of transistors 21′ and 22′ are coupled together by lead 56 through a single isolating diode 60 to a signal input terminal 64.

A positive D.C. power source V which serves to furnish operating base current to the transistors is coupled through separate resistors 70 to the leads 35, 42, 49, and 56 and thus to the bases of all of the control transistors.

With respect to the decimal-displaying transistors, transistors 23, 23′ and 27, 27′ have their bases connected together to a row lead 72, transistors 24, 24′ and 28, 28′ have their bases connected together to a row lead 76, transistors 25, 25′ and 29, 29′ have their bases connected together to a row lead 80, and transistors 26, 26′ and 30, 30′ have their bases connected together to a row lead 84. The collector of transistor 21 is connected by column lead 85 to the emitter electrodes of the column of transistors including 23, 24, 25, and 26; the collector of transistor 21′ is connected by column lead 86 to the emitter electrodes in the column of transistors including 23′, 24′, 25′, and 26′; the collector of transistor 22 is connected by column lead 87 to the emitter electrodes of the column of transistors 27, 28, 29, and 30; and the collector of transistor 22′ is connected by column lead 88 to the emitter electrodes of the column of transistors 27′, 28′, 29′, and 30′.

The circuit 10 includes means for providing a visual display of the decimal number which results from a decoding operation. The preferred display means is an electronic device such as the type 6844A gaseous cold cathode indicator tube sold under the trademark Nixie and represented schematically by numeral 90. This type of tube includes an anode electrode 94 which is connected to a positive D.C. power supply V1 and the desired number of cathodes 98, each of which is in the form of a different numeral. Only five cathodes are shown in the tube 90; however, in the circuit 10, the numerals 1 to 16 are employed, and each collector electrode of the decimal display transistors is shown schematically connected to one glow cathode, with the order of connections, in one suitable arrangement, being as shown in FIG. 1.

Four signal input lines 110, 111, 112, and 113 including signal input terminals 120, 121, 122, 123, respectively, are coupled to the decimal registering transistors as follows. Line 110 is coupled through a diode 130 to line 84 and its associated transistors 26, 26', 30, and 30' and through a diode 131 to line 76 and its associated transistors 24, 24', 28, and 28'; line 111 is coupled through diode 132 to line 80 and its associated transistors 25, 25', 29, and 29' and through diode 133 to line 70 and its associated transistors 23, 23', 27, and 27'; line 112 is coupled through diode 134 to line 84 and its associated transistors and through diode 135 to line 80 and its associated transistors; and line 113 is coupled through diode 136 to line 76 and its associated transistors and through diode 137 to line 70 and its associated transistors. Each line 70, 76, 80 and 84 is also coupled through a separate resistor 140 to the power supply V.

In operation of the circuit 10, the input signal is a binary-coded decimal signal which includes four signal bits and their complements which, in binary language, are logical 0's or 1's. The signal bits are represented as shown by G1, G2, G3, G4 and the complements $\overline{G}1$, $\overline{G}2$, $\overline{G}3$, $\overline{G}4$, and these bits are coupled to the signal input terminals as shown in FIG. 1. A typical truth table including the sixteen possible combinations of signal bits which can be decoded by circuit 10 is as follows:

| Code Bits | | | | |
|---|---|---|---|---|
| G1 | G2 | G3 | G4 | Decimal |
| 0 | 0 | 0 | 0 | 16 |
| 0 | 0 | 0 | 1 | 14 |
| 0 | 0 | 1 | 0 | 15 |
| 0 | 0 | 1 | 1 | 13 |
| 0 | 1 | 0 | 0 | 8 |
| 0 | 1 | 0 | 1 | 6 |
| 0 | 1 | 1 | 0 | 7 |
| 0 | 1 | 1 | 1 | 5 |
| 1 | 0 | 0 | 0 | 12 |
| 1 | 0 | 0 | 1 | 10 |
| 1 | 0 | 1 | 0 | 11 |
| 1 | 0 | 1 | 1 | 9 |
| 1 | 1 | 0 | 0 | 4 |
| 1 | 1 | 0 | 1 | 2 |
| 1 | 1 | 1 | 0 | 3 |
| 1 | 1 | 1 | 1 | 1 |

For each group of bits applied, if a logical 0 appears at any input terminal and its input line, then any transistor to which the line runs is blocked. A logical 1 appearing on a line causes the associated transistor(s) to operate. Thus, considering the first combination in the truth table which has all G's logical 0 and all G's logical 1, is can be seen that transistor 20' is operated and thus determines that one of the transistors with which it is associated will provide the decoded decimal representation. In addition, of the second and third pairs of transistors, transistor 22' is operated, and it determines that one of the transistors in its column 27', 28', 29', or 30' will operate. Finally, the logical 1's associated with G1 and $\overline{G}2$ cause transistor 27' to operate and display numeral 16. The same analysis shows that each group of bits causes a different decimal transistor to operate and display a decimal numeral.

It can be seen that two signal bits (and their complements) applied to the control transistor pair select a column of transistors, and the other two bits (and their complements) select one transistor in the column.

Figure 2:
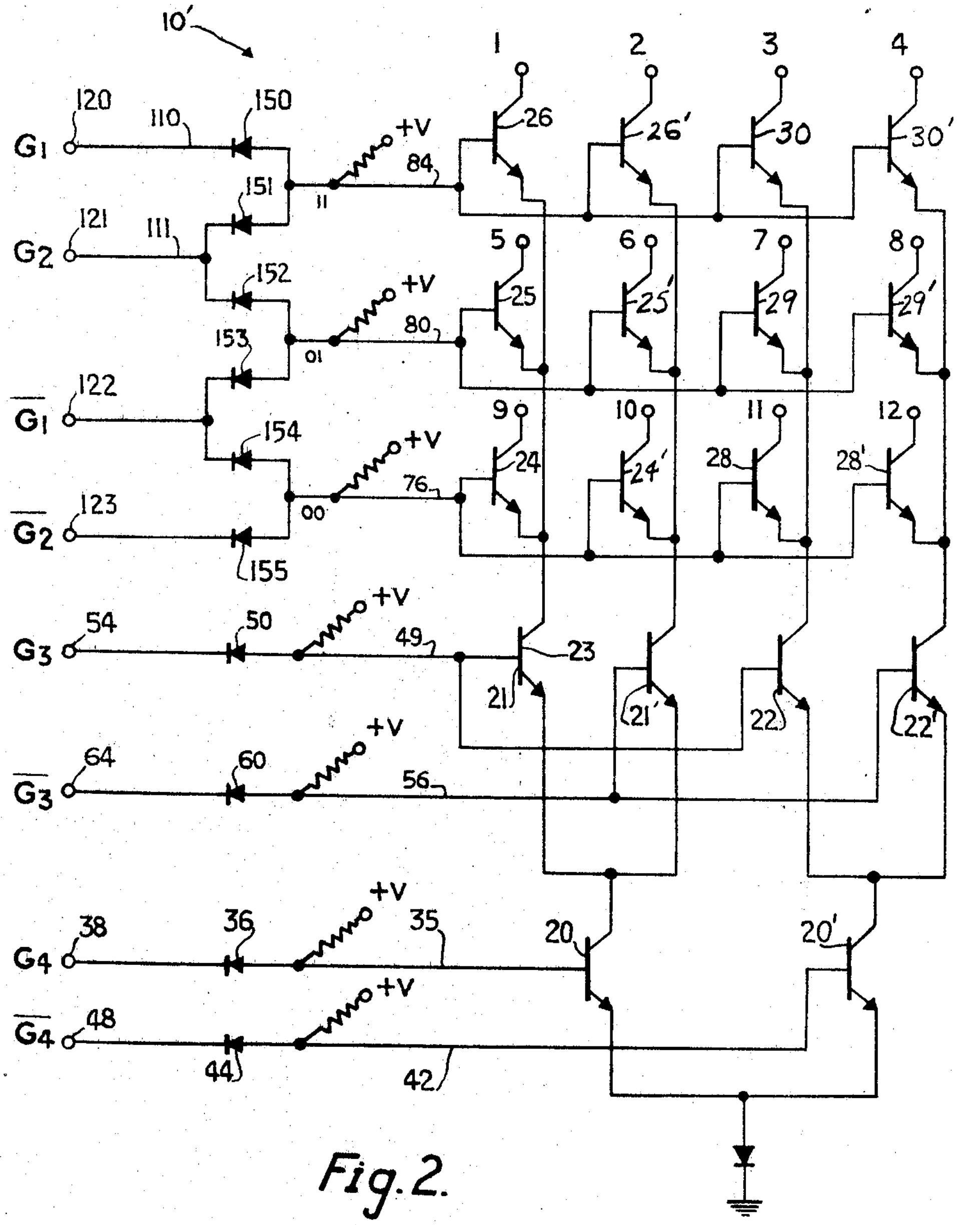
FIG. 2 is a schematic circuit representation of a modification of the invention.

A modification of the circuit 10 is shown in FIG. 2, and this circuit 10' is designed for decoding binary-coded decimal to decimal signals for the decimal numbers "0" to "9" or "1" to "10," inclusive. This is the most common type of decoding operation. The circuit 10' is essentially the same as the circuit 10; however, it has two fewer diodes and four fewer decimal registering transistors. The circuit 10' includes the control transistors 20, 20', 21, 21', 22, and 22' and only three of the horizontal rows of decimal registering transistors. Since the circuit 10' decodes to only ten decimal numbers, transistors 28 and 28', or two others as each code requires, might be omitted, or, alternatively, they might be used for some other function, for example, to operate a decimal point, a plus or minus sign, or some other apparatus.

In the circuit of FIG. 2, the binary-coded decimal bits are applied as shown, and the input terminal 120 is coupled through a diode 150 to the row lead 84 and its associated transistors; the input terminal 121 is coupled through a first diode 151 to the row lead 84 and its associated transistors and through a second diode 152 to the row lead 80 and its associated transistors; the terminal 122 is coupled through a first diode 153 to the row lead 80 and its associated transistors and a second diode 154 to the row lead 76 and its associated transistors; and the fourth terminal 123 is coupled through a diode 155 to row lead 76 and its associated transistors. The other input terminals are connected to the control transistors in the manner described above.

A typical truth table for the circuit 10' is as follows:

| Code Bits | | | | |
|---|---|---|---|---|
| G1 | G2 | G3 | G4 | Decimal |
| 0 | 0 | 0 | 0 | 12 |
| 0 | 0 | 0 | 1 | 10 |
| 0 | 0 | 1 | 0 | 11 |
| 0 | 0 | 1 | 1 | 9 |
| 0 | 1 | 0 | 0 | 8 |
| 0 | 1 | 0 | 1 | 6 |
| 0 | 1 | 1 | 0 | 7 |
| 0 | 1 | 1 | 1 | 5 |
| 1 | 1 | 0 | 0 | 4 |
| 1 | 1 | 0 | 1 | 2 |
| 1 | 1 | 1 | 0 | 3 |
| 1 | 1 | 1 | 1 | 1 |

The circuit 10' may be used with many of the known code systems merely by applying the signal bits in proper order to the input terminals and by connecting the terminal transistors to the proper decimal display character. Those skilled in the art will understand the method of determining these connections for each code with no difficulty. The truth table and input and output connections for several codes are set out below.

| Gray Code Truth Table | | | | | Code bit | Input terminal | Decimal output | Output switch |
|---|---|---|---|---|---|---|---|---|
| A | B | C | D | Decimal | | | | |
| 1 | 0 | 1 | 0 | 0 | $\overline{B}$ | 120 | 0 | 30' |
| 1 | 1 | 1 | 0 | 1 | $\overline{D}$ | 121 | 1 | 29' |
| 1 | 1 | 1 | 1 | 2 | B | 122 | 2 | 28' |
| 1 | 1 | 0 | 1 | 3 | D | 123 | 3 | 28 |
| 1 | 1 | 0 | 0 | 4 | $\overline{C}$ | 54 | 4 | 29 |
| 0 | 1 | 0 | 0 | 5 | C | 64 | 5 | 25 |
| 0 | 1 | 0 | 1 | 6 | $\overline{A}$ | 38 | 6 | 24 |
| 0 | 1 | 1 | 1 | 7 | A | 48 | 7 | 24' |
| 0 | 1 | 1 | 0 | 8 | | | 8 | 25' |
| 0 | 0 | 1 | 0 | 9 | | | 9 | 26' |

| 5311 Code Truth Table | | | | | Code bit | Input terminal | Decimal output | Output switch |
|---|---|---|---|---|---|---|---|---|
| A | B | C | D | Decimal | | | | |
| 0 | 0 | 0 | 0 | 0 | B | 120 | 0 | 25 |
| 0 | 0 | 0 | 1 | 1 | $\overline{D}$ | 121 | 1 | 24 |
| 0 | 0 | 1 | 1 | 2 | $\overline{B}$ | 122 | 2 | 24' |
| 0 | 1 | 0 | 0 | 3 | D | 123 | 3 | 26 |
| 0 | 1 | 1 | 0 | 4 | $\overline{C}$ | 54 | 4 | 26' |
| 1 | 0 | 0 | 0 | 5 | C | 64 | 5 | 29 |
| 1 | 0 | 0 | 1 | 6 | $\overline{A}$ | 38 | 6 | 28 |
| 1 | 0 | 1 | 1 | 7 | A | 48 | 7 | 28' |
| 1 | 1 | 0 | 0 | 8 | | | 8 | 30 |
| 1 | 1 | 1 | 0 | 9 | | | 9 | 30' |

| 242'1 Code Truth Table | | | | | | | | |
|---|---|---|---|---|---|---|---|---|
| A B C D | Decimal | Code bit | Input terminal | Decimal output | Output switch |
| 0 0 0 0 | 0 | $\bar{A}$ | 120 | 0 | 26 |
| 0 0 0 1 | 1 | $\bar{B}$ | 121 | 1 | 26′ |
| 1 0 0 0 | 2 | A | 122 | 2 | 25 |
| 1 0 0 1 | 3 | B | 123 | 3 | 25′ |
| 1 0 1 0 | 4 | $\bar{D}$ | 54 | 4 | 29 |
| 1 0 1 1 | 5 | D | 64 | 5 | 29′ |
| 1 1 0 0 | 6 | $\bar{C}$ | 38 | 6 | 24 |
| 1 1 0 1 | 7 | C | 48 | 7 | 24′ |
| 1 1 1 0 | 8 | | | 8 | 28 |
| 1 1 1 1 | 9 | | | 9 | 28′ |

| Watts Code Truth Toble | | | | | |
|---|---|---|---|---|---|
| A B C D | Decimal | Code bit | Input terminal | Decimal output | Output switch. |
| 0 0 0 0 | 0 | B | 120 | 0 | 25 |
| 0 0 0 1 | 1 | $\bar{D}$ | 121 | 1 | 24 |
| 0 0 1 1 | 2 | $\bar{B}$ | 122 | 2 | 24′ |
| 0 0 1 0 | 3 | D | 123 | 3 | 25′ |
| 0 1 1 0 | 4 | $\bar{C}$ | 54 | 4 | 26′ |
| 1 1 1 0 | 5 | C | 64 | 5 | 30′ |
| 1 0 1 0 | 6 | $\bar{A}$ | 38 | 6 | 29′ |
| 1 0 1 1 | 7 | A | 48 | 7 | 28′ |
| 1 0 0 1 | 8 | | | 8 | 28 |
| 1 0 0 0 | 9 | | | 9 | 29 |

What is claimed is:

1. A signal decoder circuit for decoding binary-coded decimal signals to decimal signals comprising a first control switching device, a second control switching device, third and fourth control switching devices, fifth and sixth control switching devices, seventh, eighth, ninth, and tenth display switching devices, eleventh, twelfth, thirteenth, and fourteenth display switching devices, fifteenth, sixteenth, seventeenth, and eighteenth display switching devices, nineteenth, twentieth, twenty-first, and twenty-second display switching devices, each of said display switching devices and control switching devices having an input, output, and reference electrode, the output electrode of said first control switching device being connected to the commonly connected reference electrodes of said third and fourth control switching devices, the output electrode of said second control switching device being connected to the commonly connected reference electrodes of said fifth and sixth control switching devices, the reference electrodes of said first and second control switching devices being connected together and to a source of reference potential, a source of a first signal bit coupled through a diode to the input electrode of said first control switching devices, a source of a second signal bit coupled through a diode to the input electrode of said second control switching device, a source of a third signal bit coupled through a diode to the input electrodes of said third and fifth control switching devices, a source of a fourth signal bit coupled through a diode to the input electrodes of said fourth and sixth control switching devices, a source of a fifth signal bit coupled through a diode to the input electrodes of said nineteenth, twentieth, twenty-first, and twenty-second display switching devices, and through another diode to the input electrodes of said fifteenth, sixteenth, seventeenth, and eighteenth display switching devices, a source of a sixth signal bit coupled through a diode to the input electrodes of said eleventh, twelfth, thirteenth, and fourteenth display switching devices, and through another diode to the input electrodes of said seventh, eighth, ninth, and tenth display switching devices, a source of a seventh signal bit coupled through a diode to the input electrodes of said nineteenth, twentieth, twenty-first, and twenty-second display switching devices, and through another diode to the input electrodes of said eleventh, twelfth, thirteenth, and fourteenth display switching devices, and a source of an eighth signal bit coupled through a diode to the input electrodes of said fifteenth, sixteenth, seventeenth, and eighteenth display switching devices, and through another diode to the input electrodes of said seventh, eighth, ninth and tenth display switching devices, the output electrode of said third control switching device being coupled to the reference electrodes of said seventh, eleventh, fifteenth, and nineteenth display switching devices, the output electrode of said fourth control switching device being connected to the reference electrodes of said eighth, twelfth, sixteenth, and twentieth display switching devices, the output electrode of said fifth control switching device being connected to the reference electrodes of said ninth, thirteenth, seventeenth, and twenty-first display switching devices, and the output electrode of said sixth control switching device being connected to the reference electrodes of said tenth, fourteenth, eighteenth, and twenty-second display switching devices, the ouput electrodes of said display switching devices connected, each to a different decimal number display means, said first and second signals applied to said first and second control switching devices determining which of said first and second control switching devices is operative in a decoding operation, said first control switching device controlling the operative state of said third and fourth control switching devices in conjunction with said third and fourth signals, said second control switching device controlling the operative state of said fifth and sixth control switching devices in conjunction with said third and fourth signals, said third control switching device controlling the operative state of said seventh, eleventh, fifteenth, and nineteenth display switching devices, said fourth control switching device controlling the operative state of said eighth, twelfth, sixteenth, and twentieth display switching devices, said fifth control switching device controlling the operative state of said ninth, thirteenth, seventeenth, and twenty-first display switching devices, and said sixth control switching device controlling the operative state of said tenth, fourteenth, eighteenth, and twenty-second display switching devices, the control by said third, fourth, fifth, and sixth control switching devices being in conjunction with said fifth and sixth, and seventh and eighth signal bits to render operative only one of said display switching devices, which represent the decimal equivalent of the binary coded decimal number represented by said signal bits.

2. The circuit defined in claim 1 wherein all of said devices are semiconductor devices having a base electrode which is its input electrode, a collector electrode which is its output electrode, and an emitter electrode which is its reference electrode.

3. The circuit defined in claim 1 wherein signal bits one and two are complements of each other, signal bits three and four are complements of each other, signal bits five and six are complements of each other, and signal bits seven and eight are complements of each other.

References Cited

UNITED STATES PATENTS

| | | | |
|---|---|---|---|
| 3,146,436 | 8/1964 | Crow | 340—347 X |
| 3,355,598 | 11/1967 | Tuska | 340—347 X |

MAYNARD R. WILBUR, Primary Examiner

M. K. WOLENSKY, Assistant Examiner

U.S. Cl. X.R.

235—155; 307—242

UNITED STATES PATENT OFFICE
CERTIFICATE OF CORRECTION

Patent No. 3,504,363 March 31, 1970

James J. Klinikowski

It is certified that error appears in the above identified patent and that said Letters Patent are hereby corrected as shown below:

Column 1, line 31, after "be" insert -- a --. Column 2, line 10, "sistors" should read -- transistors --; same line 10, "have their emitters connected through" should read -- , a second pair of control transistors --. Column 3, line 51, "G's", second occurrence, should read -- $\overline{G}$'s --; line 52, "is", first occurrence, should read -- it --; line 58, "G1" should read -- $\overline{G}1$ --. Column 5, line 60, "devices" should read -- device --.

Signed and sealed this 22nd day of December 1970.

(SEAL)
Attest:

Edward M. Fletcher, Jr.
Attesting Officer

WILLIAM E. SCHUYLER, JR.
Commissioner of Patents